United States Patent [19]

Lanagan et al.

[11] Patent Number: 5,674,814
[45] Date of Patent: Oct. 7, 1997

[54] SYNTHESIS OF INCREASED-DENSITY BISMUTH-BASED SUPERCONDUCTORS WITH COLD ISOSTATIC PRESSING AND HEAT TREATING

[75] Inventors: Michael T. Lanagan, Woodridge; John J. Picciolo, Lockport; Stephen E. Dorris, La Grange Park, all of Ill.

[73] Assignee: University of Chicago, Chicago, Ill.

[21] Appl. No.: 339,358

[22] Filed: Nov. 14, 1994

[51] Int. Cl.$^6$ .......................... H01L 39/24; H01L 39/12; B29C 43/10; C04B 35/453

[52] U.S. Cl. .......................... 505/491; 505/739; 505/742; 505/782; 505/121; 505/501; 505/432; 505/492; 29/599

[58] Field of Search .................. 505/739, 742, 505/782, 121, 491, 501, 432, 492; 252/521; 29/599; 501/123

[56] References Cited

U.S. PATENT DOCUMENTS

| | | | |
|---|---|---|---|
| 4,629,515 | 12/1986 | Imaizumi | 29/599 X |
| 5,057,488 | 10/1991 | Arendt et al. | 252/521 X |
| 5,081,072 | 1/1992 | Hosokawa et al. | 29/599 X |
| 5,093,314 | 3/1992 | Takahashi et al. | 505/701 X |
| 5,104,849 | 4/1992 | Shiga et al. | 505/704 X |
| 5,108,985 | 4/1992 | Iino et al. | 505/739 X |
| 5,145,829 | 9/1992 | Asano et al. | 505/739 X |
| 5,145,833 | 9/1992 | Prunier et al. | 505/739 X |
| 5,223,478 | 6/1993 | Whitlow et al. | 505/705 X |
| 5,229,358 | 7/1993 | Kumar | 505/740 X |
| 5,232,908 | 8/1993 | Shiga et al. | 505/739 X |
| 5,244,874 | 9/1993 | Yamamoto et al. | 505/705 X |
| 5,246,917 | 9/1993 | Hikata et al. | 505/740 X |
| 5,262,398 | 11/1993 | Nagata et al. | 505/739 X |
| 5,288,679 | 2/1994 | Su | 505/740 X |
| 5,288,699 | 2/1994 | Sato et al. | 29/599 X |
| 5,296,456 | 3/1994 | Shiga et al. | 505/704 X |
| 5,354,535 | 10/1994 | Dorris et al. | 505/433 |

FOREIGN PATENT DOCUMENTS

| | | |
|---|---|---|
| 5190035 | 7/1993 | Japan . |
| 5266734 | 10/1993 | Japan . |
| 94/00886 | 1/1994 | WIPO . |

OTHER PUBLICATIONS

Goretta, K.C., et al., "Processing and properties of bulk BiSrCaCuO superconductors", *Appl. Supercond.*, 2(6) (1994), 411–415 (Chem. Abs. 122:279380).

Nhien, S., et al., "Bulk Texturing of Prereacted Bi/Pb (2223) under Triaxial Stresses at Room Temperature", *Physica C*, 235–240 (Part V) (Dec. 1994), 3403–3404 (Proceedings of Jul. 5–9, 1994 Conference).

Plecháček, V., "Improvement of the magnetic shielding and trapping properties of BiPbSrCaCuO superconducting tubes by the use of multiple thermomechanical processing", *Physica C*, 225 (3&4) (20 May 1994), 361–368.

Yamada, Yutaka, et al., "Bismuth–based oxide superconducting current leads", *Teion Kogaku*, 28(2) (1993), 86–91 (Chem. Abs. 119:129370).

Chen, Nan, et al., "Sinter-forged (Bi, Pb)$_2$Sr$_2$Ca$_2$Cu$_3$O$_x$ superconductors", *Supercond. Sci. Technol.*, 6(9) (Sep. 1993), 674–677.

Yoo, J.M., et al., "The stability of high–Tc phase in the Bi$_{1.6}$Pb$_{0.4}$Sr$_2$Ca$_2$Cu$_3$O$_z$ compounds prepared by hot isostatic pressing", *Journal of Materials Science*, 28(9) (1 May 1993), 2361–2365.

Loberg, B., et al., "High critical currents in Bi–2223 phase bars", *Cryogenics*, 33(5) (May 1993), 475–6.

Ishii, M., et al., "Improvement in the magnetic shielding property of Bi(Pb)–Sr–Ca–Cu–O superconducting tubes", *Journal of Materials Science Letters*, 11(23) (1 Dec. 1992), 1614–6.

Yamada, Yutaka, et al., "Bismuth–based oxide superconducting current lead", *Teion Kogaku*, 26(6) (1991), 495–501 (Chem. Abs. 117:13059).

Keschtkar, H., "Fabrication and characterization of high–Tc–superconductors", *Int. Conf. Powder Metall.*, Issue 2 (1990), 434–7 (Chem. Abs. 115:285449).

*Primary Examiner*—Douglas J. McGinty
*Attorney, Agent, or Firm*—Foley & Lardner

[57] ABSTRACT

The present invention is directed to a process for producing high temperature superconducting ceramic materials. More particularly, the present invention is directed to a process that enhances the densification of $Bi_{1.8}Pb_{0.4}Sr_2Ca_2Cu_3O_{10}$ "BSCCO" ceramics.

12 Claims, 4 Drawing Sheets

SYNTHESIS OF INCREASED-DENSITY BISMUTH-BASED SUPERCONDUCTORS WITH COLD ISOSTATIC PRESSING AND HEAT TREATING

BACKGROUND OF THE INVENTION

The United States government has rights in this invention pursuant to Contract W-31-109-ENG-38 between the United States Department of Energy and the University of Chicago, representing Argonne National Laboratory.

The present invention is directed to a process for producing high temperature superconducting ceramic materials. More particularly, the present invention is directed to a process that enhances the densification of $Bi_{1.8}Pb_{0.4}Sr_2Ca_2Cu_3O_{10}$ "BSCCO" ceramics.

High temperature superconductor materials show great promise for use in new technologies. However, in order to make practical use of such materials in commercial applications, substantial improvements in electrical performance, mechanical reliability and chemical and cryogenic stability must be achieved.

Possible applications for bulk monolithic high-temperature superconductors include current leads, cryogenic fluid level sensors, and fault current limiters. For applications such as current leads, applied magnetic fields are modest and the required transport critical current density ($J_c$) can be as low as approximately 100 A/cm². High-$T_c$ superconducting current leads have two requirements: (1) a low thermal conductivity, and (2) a low electrical resistivity. Silver clad conductors are not as useful in this application primarily due to the large thermal conductivity of silver.

Substantial work has been performed on the design, testing, and fabrication of $YBa_2Cu_3O_x$ (123), $Bi_2Sr_2CaCu_2O_x$ (2212), and $(BiPb)_2Sr_2Ca_2Cu_3O_x$ (2223) leads. The bismuth-based materials provide more stable oxygen content, improved current carrying capacity and better resistance to environmental degradation than yttrium-based materials. Rods and bars suitable for current leads have been found to be produceable by various combinations of pressing and sintering, melt casting, hot extrusion, and hot pressing. The 2212 composition is the superior material for melt casting because of the more severe phase separation and attendant problems that arise in melting of 2223. However, due largely to its higher transition temperature ($T_c$), 2223 generally exhibits $J_c$ values at 77 K superior to those of 2212. Conventional powder compaction and consolidation processes involve pressing and subsequent heat treatment to form a dense ceramic. Such heat treatments, however, cause a decrease in the density of Bi-based superconductors.

It is therefore an object of the invention to provide an improved article of manufacture and method of making a BSCCO superconducting ceramic material.

It is another object of the invention to provide a novel article of manufacture and method of producing a BSCCO superconducting ceramic having higher density levels than prior art BSCCO ceramics.

It is a further object of the invention to provide an improved article and method of manufacture of BSCCO superconducting ceramic material using a series of isostatic pressing steps in combination with heat treating steps.

These objects and other advantages of the invention will be readily apparent from the following description of the preferred embodiments thereof, taken in conjunction with the accompanying drawings described hereinbelow.

DETAILED DESCRIPTION OF PREFERRED EMBODIMENTS

Figure 1:
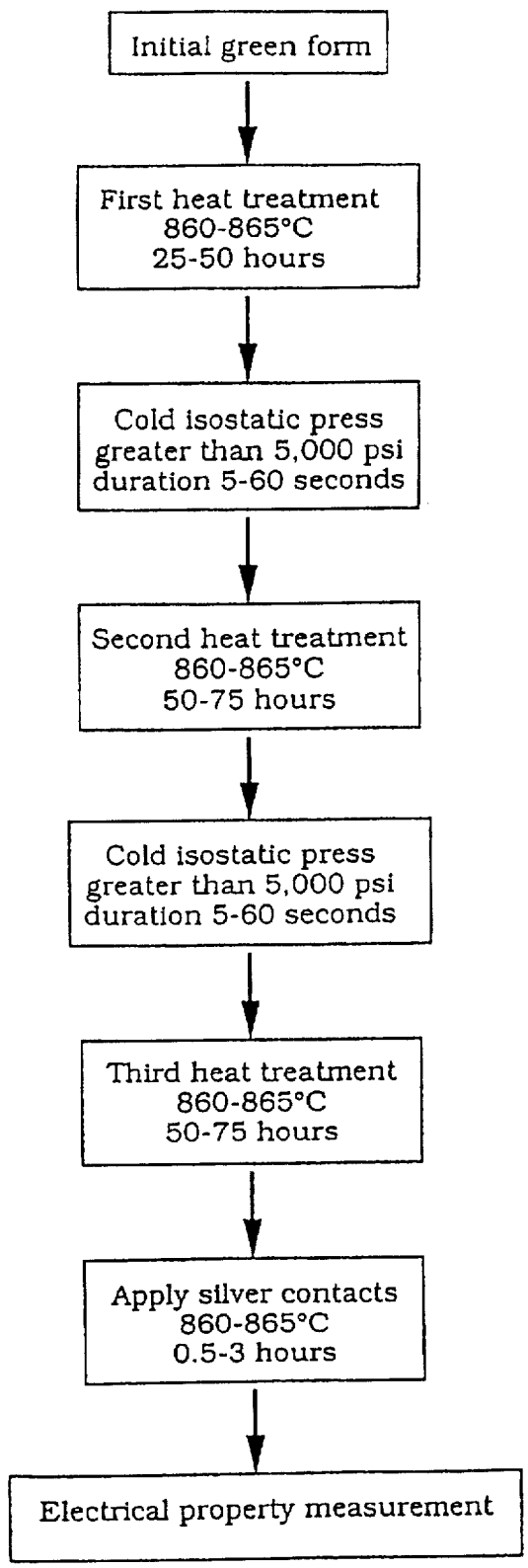
FIG. 1 illustrates a flow chart of process steps of a preferred form of the invention.

Conventional powder compaction and consolidation processes involve pressing and subsequent heat treatment to form a dense ceramic. The density of bismuth-based superconductors decrease upon heat treatment; therefore, several consolidation and heat treatment steps have been found to be necessary to increase density. FIG. 1 is a flowchart of a preferred process of the present invention. The following steps are the most highly preferred process for achieving a dense bismuth based superconductor with good electrical properties, though it will be apparent to one of ordinary skill in the art that various parameters can be modified without departing from the scope of the invention.

The fabrication process starts with $Bi_{1.8}Pb_{0.4}Sr_2Ca_2Cu_3O_{10}$ powder that is composed of a well known phase assemblage. While various powder preparation methods can be used, preferably the materials and methods used are those described in U.S. patent application Ser. No. 08/043,652 filed Apr. 6, 1993 by the present assignee, now U.S. Pat. No. 5,354,535 (please see the "Detailed Description of Preferred Embodiments" incorporated herein by reference). The initial ceramic form can be prepared by various conventional methodologies, such as uniaxially pressed, cold isostatically pressed ("CIP"), tape cast, slip cast, and extruded. Organic binders can be added to increase the green strength of the initial ceramic form.

The first heat treatment process is preferably carried out in air at 865° C. for 50 hours. In other embodiments, the atmosphere can comprise an oxygen-containing gas. The sintering temperature should preferably be near to, but less than, the incongruent melting temperature ($T_{mp}$=870° C.) for enhanced reaction and sintering kinetics. Nonsuperconducting phases will form if the sintering temperature exceeds the incongruent melting temperature. The incongrueut melting temperature will decrease in the presence of Ag ($T_{mp}$=853° C.) and is also dependent on oxygen partial pressure.

Figure 2:
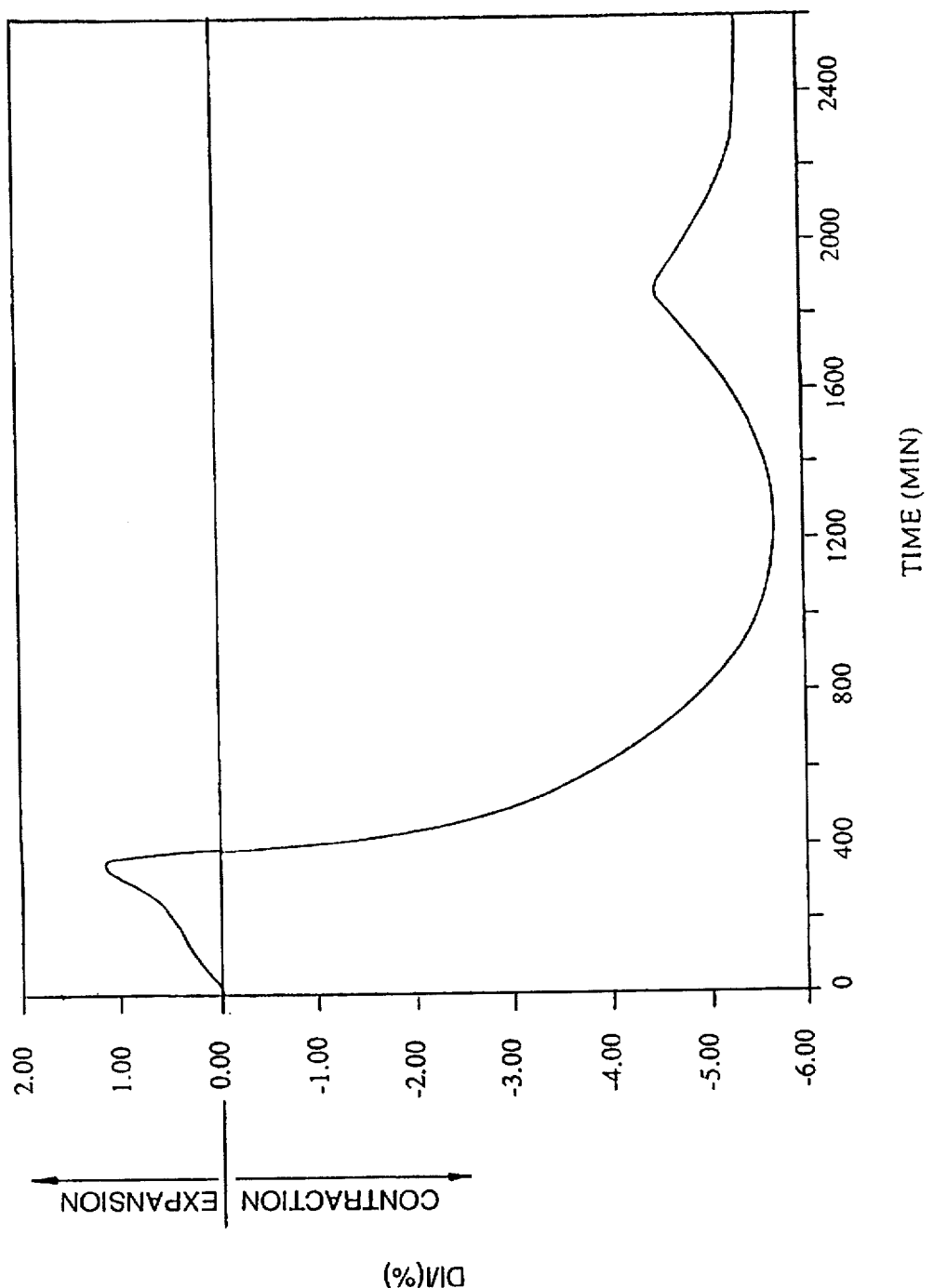
FIG. 2 shows dilatometric contraction and expansion of a BSCCO material during heat treating.

As shown in FIG. 1, the first heat treatment preferably achieves appropriate kinetic conditions, such as exceeding 25 hours at 865° C., to allow for grain growth and retrograde densification. Therefore, at lower temperatures, longer time periods will be required to achieve the same kinetic results obtained at higher temperatures. The dilatometer data plotted in FIG. 2 show that density increases during the initial stages of heat treatment and then decreases after about seventeen hours. Cold isostatic pressing is not advantageous during the early stages of sintering (less than about twenty-five hours at 865° C.) because densification naturally occurs during heat treatment.

After the fifty hours of heat treatment, a deformation process is performed to increase density. Specimens are sealed in latex bags and loaded into a chamber with an oil/water medium. Samples are preferably cold-isostatically pressed at twenty thousand pounds per square inch. While a wide range of pressure can be used, it was determined the pressure should preferably exceed five thousand pounds per square inch to ensure proper densification. The cold-isostatically pressed parts are removed from the chamber and dried; the latex bag is cut away from the sample; and density is measured before further heat treatment.

Figure 3:
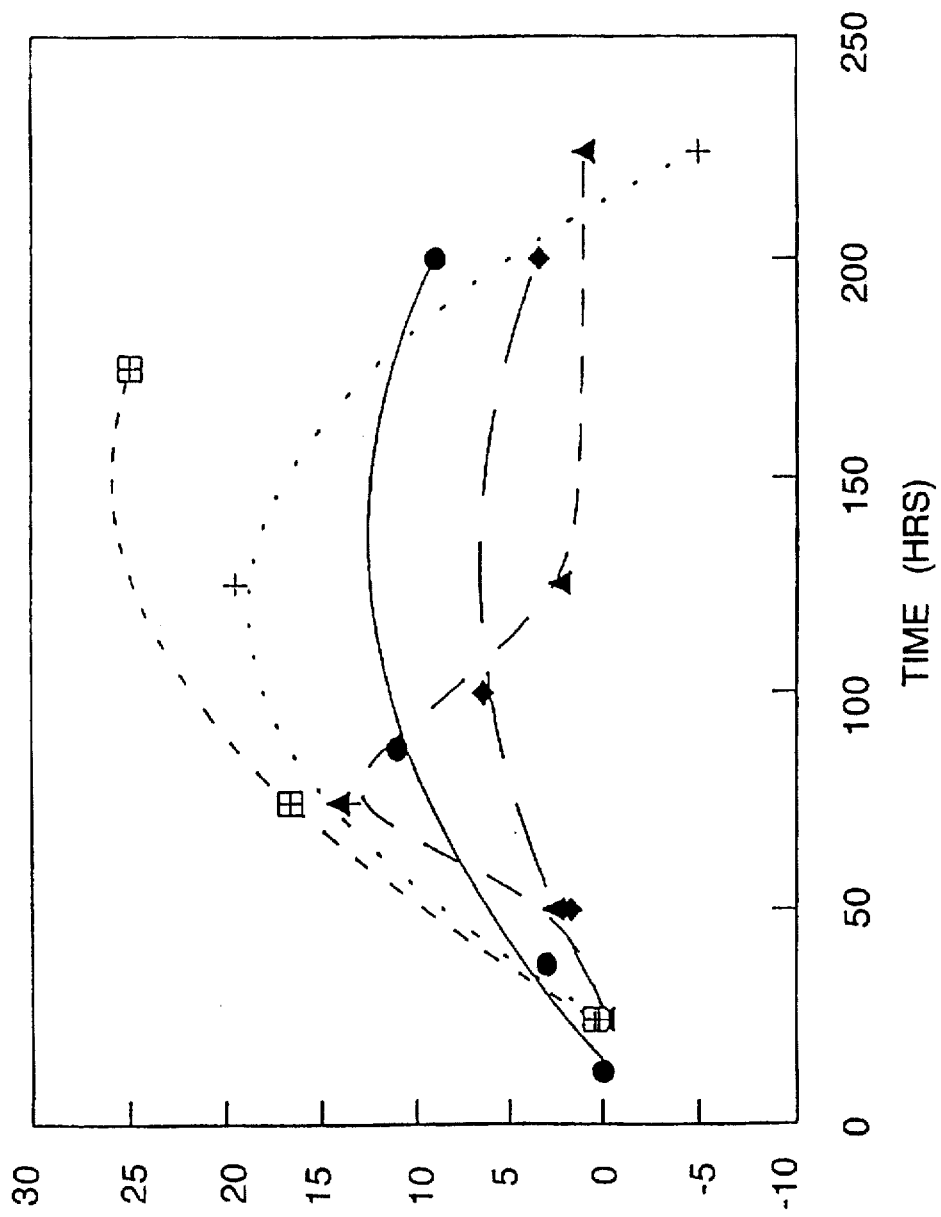
FIG. 3 illustrates the effect of pressing on the critical current properties of a BSCCO material.

The thermomechanical schedule was developed from data taken on silver clad bismuth-based tapes that were uniaxially pressed (see FIG. 3). Five separate pressing sequences were carried out to empirically determine the optimum pressing schedule. The individual data points in FIG. 3 define the time at which the thermal treatment was interrupted and the specimens were pressed. As can be seen in FIG. 3, the largest increase in critical current density is produced by pressing at a time selected between fifty and one hundred fifty hours of heat treatment.

Figure 4:
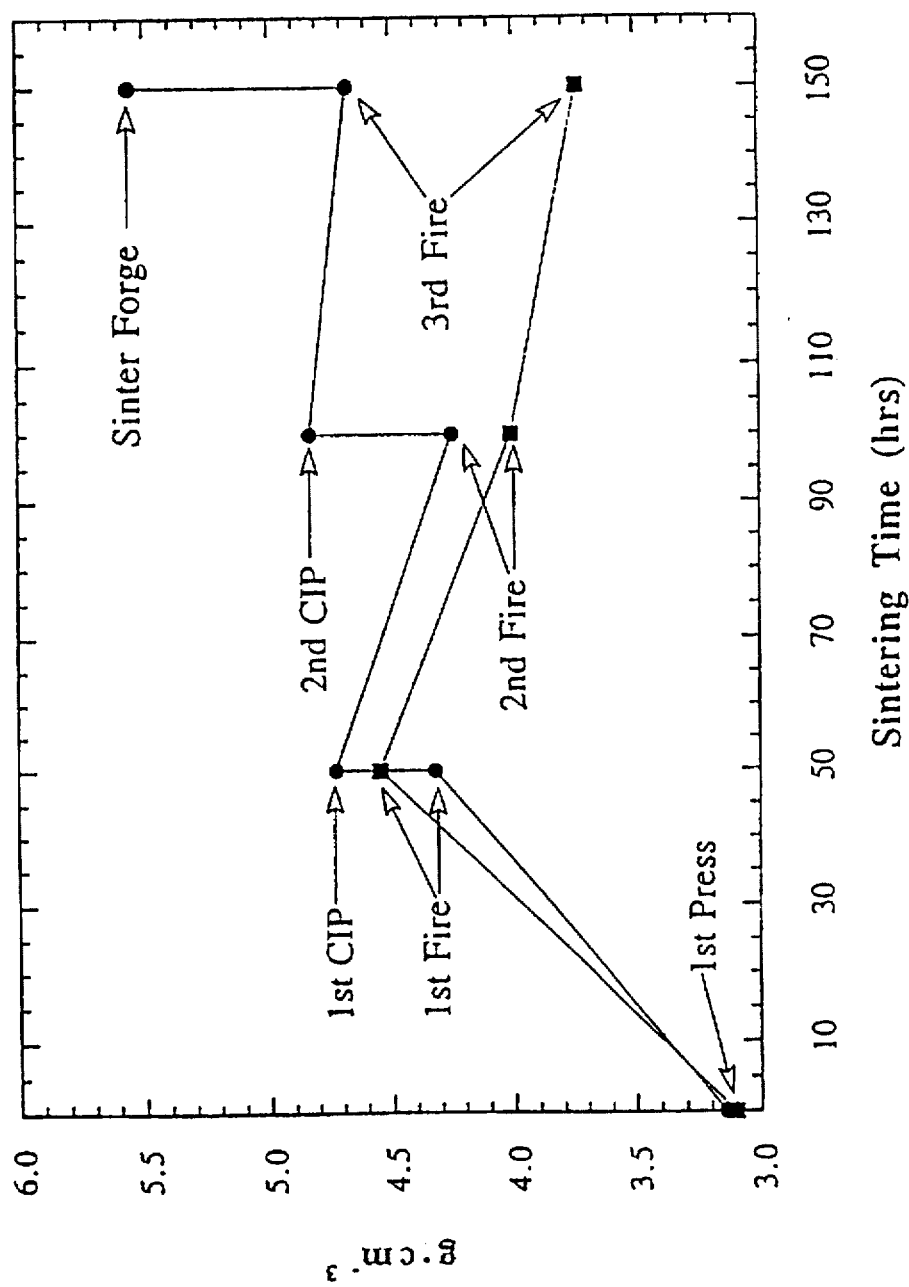
FIG. 4 shows a BSCCO material density measured for various pressing and heat-treating conditions over sintering time.

FIG. 4 displays the density progression for a preferred thermomechanical sequence. A comparison was made between a control bar and a test bar. The control bar was heated for one hundred fifty hours without intermediate pressing, as shown by the lower plot in FIG. 4. The test bar was cold-isostatic pressed twice during the one hundred fifty hour heat treatment, as illustrated by the upper plot in FIG. 4. Consistent with dilatometer data, density decreased after fifty hours of heat treatment. Additional density increase was achieved by cold isostatic pressing and a thirty percent increase in the final density was achieved by the improved thermomechanical process.

The improvement in critical current density ("$J_c$" hereinafter) during the thermomechanical sequence is summarized in Table 1:

TABLE 1

Electrical Properties Improvement During Thermomechanical Sequence

| | Critical Current Density (A/cm$^2$) |
|---|---|
| First CIP, First Heat Treatment | 13 |
| Second CIP, Second Heat Treatment | 570 |
| Third CIP, Third Heat Treatment | 912 |
| Fourth CIP, Fourth Heat Treatment | 230 |

The increase in $J_c$ has been observed for six specimens, thus showing the reproducibility of this process. Data illustrated in Table 1 showed that $J_c$ decreased for a fourth CIP and heat treatment. The low critical current density present after the first heat treatment is believed to be caused by lack of conversion from the 2212 to the 2223 phase. The presence of two phases originates from using a reactive phase sintering approach wherein one starts with two powders. X-ray diffraction data showed that significant amounts of the 2212 phase remain after 50 h of heat treatment; however, after 100 h of heat treatment, the 2223 phase was determined to be the primary superconducting phase.

For a current lead device, electrical contacts were applied by painting a silver slurry onto the superconductor, and the slurry is composed of five μm silver flakes, xylene/butanol solvent, menhaden fish oil dispersant, and acryloid binder. The contacts were fired onto the superconductor at a temperature of 865° C. for 1 hour. Unlike sintering, the heat treatment temperature for the electrical contacts should be above (about ten C°) the eutectic melting point between BSCCO and silver (($T_{mp}$=853° C.). This method ensures a good bond between the BSCCO and the silver.

The $J_c$ was measured by a standard four-probe technique. All electrical measurements were carried out at 77 K in zero applied magnetic field. Current densities ($J_c$=900 A/cm$^2$, $I_c$=300 A) were determined to be a factor of three larger than similar components manufactured from yttrium-based superconductors. In addition to producing a superconducting bar for current lead application, this thermomechanical process provides a method to produce high quality material for a variety of applications including stock for sinter forging.

EXAMPLES

The following nonlimiting examples illustrate exemplary methods of preparation and end products.

Example 1

A 2212 powder was synthesized from $Bi_2O_3$, $SrCO_3$, $CaCO_3$, and $CuO$. The precise composition was $Bi_2Sr_{2.15}Ca_{0.9}Cu_2O_x$. The powders were milled, calcined in air, melted in an $Al_2O_3$ crucible, and splat quenched; the result was a homogeneous, oxygen-deficient precursor. Bars were then prepared by directional solidification. The splat-quenched material was ground, placed in a silver-lined $Al_2O_3$ crucible, melted in Ar at 900° C., and then cooled to approximately 850° C. The furnace atmosphere was then switched to oxygen, and the samples were held for 100 hours. The resultant specimens were approximately 92% dense and highly textured. Scanning electron microscopy (SEM) and quantitative energy-dispersive spectroscopy (EDS) of the cast sample revealed a thin surface layer containing 2212, $Bi_2Sr_{4-y}Ca_yO_x$, $Sr_{1-y}Ca_yO_x$, and CaO. A 2122 phase and traces of CuO and $Bi_2Sr_{2-y}Ca_yCuO_x$ (2201) were detected in the bulk of each bar.

Example 2

The 2223 powders were prepared from the intermediate phases $Bi_{1.8}Pb_{0.4}Sr_2CaCu_2O_x$ and $CaCuO_2$, which were synthesized from $Bi_2O_3$, PbO, $SrCO_3$, $CaCO_3$, and CuO mixtures. The powders were calcined at 750° C. for 6 hours in oxygen at a reduced total pressure of approximately 4×10$^2$ Pa of oxygen to ensure complete decomposition of the carbonates. In order to produce nearly single-phase materials, the powders were subjected to ambient-pressure $CO_2$-free air at 840° C. for 24 hours for the $Bi_{1.8}Pb_{0.4}Sr_2CaCu_2O_x$ and 900° C. for 48 h for the $CaCuO_2$. To obtain highly phase-pure 2223, the $Bi_{1.8}Pb_{0.4}Sr_2CaCu_2O_x$ and $CaCuO_2$ were ball-milled and heated in dry, $CO_2$-free air for 50 hours at 840° C., ball-milled and heated again for 50 hours at 855° C. The fraction of 2223, as determined by X-ray diffraction, was approximately 95%.

The 2223 powders were formed into bars in two ways. In the first method, powder was loaded into a thin-walled rubber tube which was then evacuated and cold-isostatically pressed at approximately 140 MPa. The bars were removed, sintered in air at 865° C. for 50 hours, sealed within another evacuated rubber tube, cold-isostatically pressed again at approximately 140 MPa and sintered at 865° C. for an additional 50 hours. During heat treatment, synthesis of the 2223 phase and sintering occurred simultaneously. The cold isostatic pressing densified the bars, but the heat treatment caused slight dedensification because of extensive grain growth in only two dimensions. As shown in FIG. 1, two cold isostatic press steps were performed to obtain densities greater than approximately 4.6 g/cm$^3$. Final bar densities were approximately 78% of theoretical when two or three cold isostatic press steps were employed.

Example 3

In the second method, bars were initially pressed uniaxially at 70 MPa in a steel die. The resultant bars were approximately 50% dense and were further processed by sinter forging in air at 840°–850° C. under compression rates of 0.001–0.005 mm/min. To minimize contamination of the bars, silver foil separated the 2223 from $Al_2O_3$ compression rams. The final stress on each bar was 2–3 MPa; specimen thicknesses were reduced by approximately 65–75% during forging. The silver foil was easily removed from the bars after forging. Final specimens were approximately 95% dense and exhibited very strong textures, with the c-axes parallel to the pressing direction.

Critical temperature ("$T_c$") values were determined with a SQUID magnetometer: samples were cooled in zero field below $T_c$, a field of 0.5 oersted was applied, and magnetization was monitored during warming. Transport critical current ("$I_c$" hereinafter) and $J_c$ were measured by a four-probe method with a pulsed current source. Contacts were applied as a slurry of silver powder in an organic solvent. The coated specimens were dried and annealed in air at approximately 800° C. Critical currents were often very large; therefore, for $J_c$ testing, smaller specimens were occasionally cut from the bars with a slow speed diamond blade saw.

To determine fracture strength ($\sigma_f$), bars approximately 25×3×3 mm were cut. The tensile edges of the samples were smoothed and beveled by grinding with 600-grit SiC paper, and the bars were loaded in four-point bending at a rate of 1.27 mm/min. The inner and outer load spans were 9.6 mm and 19.2 mm, respectively. Fracture toughness ($K_{IC}$) values were determined by the single-edge notched-Beam method. The test bars were loaded in three-point bending at a rate of 1.27 mm/min. $K_{IC}$ was calculated from $K_{IC}=3$ P L Y $(C)^{0.5}$/B $W^2$, where P is the load at fracture, L is the support-span distance, Y is a constant related to the specimen geometry, C is the notch depth, B is the specimen width, and W is the specimen height. At least four bars were tested to determine each strength and toughness. Fracture surfaces of a few bars were examined by SEM. The extent of grain alignment was examined qualitatively by standard X-ray diffraction analysis.

In evaluating the relative merits of the three processes for producing bulk bars, it is important to bear in mind the forms that can be manufactured economically. Directional solidification of 2212 has the advantages of requiring no Pb in the material and ease of solidification over arbitrary lengths. Disadvantages are the low $T_c$ of 2212 relative to 2223 and the somewhat irregular surface of the solidified material. Cold isostatic pressing and sintering of 2223 makes use of simple, readily available equipment, and lengths of one to two meters can be made with ease; however, it requires by far the most time of the three processes. Sinter forging is rapid and, because the deformation is performed hot, the resultant properties tend to be uniform. Press designs and furnaces sizes, however, restrict practical lengths to approximately 30 cm.

$T_c$ values of the bars were within the ranges of expected values. The 2212 had a $T_c$ of 92 K, which is very favorable for that compound. The $T_c$ of the cold isostatic pressed and sintered 2223 was 107 K. Sinter forging in air produced a $T_c$ of 106 K, with a sharp transition.

Current-carrying capacity at 77 K is of most interest for most commercial applications. Many bars were made before the superconducting properties were optimized. Data for the best $I_c$ and $J_c$ obtained are shown in Table 2:

TABLE 2

Data for 2212 and 2223 bars: $T_c$, and $I_c$ and $J_c$ at 77 K.

| Bar | $T_c$(K) | $I_c$(A) | $J_c$(A/cm$^2$) |
|---|---|---|---|
| 2212 | 92 | 270 | 450 |
| CIPed 2223 | 107 | 285 | 1000 |
| Forged 2223 | 106 | 300 | 8000 |

All of the bars carded at least 270 A and had a corresponding $J_c$ of at least 450 A/cm$^2$. The best sinter forgings were smaller than the other bars, and therefore had significantly higher $J_c$ values for similar $I_c$ values. For some of the best bars, the silver contacts spalled during pulsed-current testing, and the maximum $I_c$ thus could not be reached. Measured $J_c$ for the 2212 and cold isostatic pressed 2223 was generally within the range of what has been reported for bulk 2212 and 2223. The sinter-forging $J_c$, however, exceeded by 25–50% the values reported for good thick films.

Bars were also measured in applied magnetic field. The $J_c$ of the best 2223 bars decreased by approximately 85% in a 0.15 T field. At 4.2 K—where only a 100-A source was available—a sinter forging carded the full 100 A in a 15 T field. Many current leads operate at total currents of approximately 1000 A. Thus, no more than a few bars of appropriate length would be required of any of these materials. The sinter forgings had the highest $J_c$ values, but have the disadvantage of being the most difficult to produce in long lengths.

As discussed previously, good bulk superconductors must be robust. Handling and operational stresses can be significant. Strength and fracture toughness data for the three materials are summarized in Table 3:

TABLE 3

Strength and toughness data for 2212 and 2223 bars:

| Bar | $\sigma_f$(MPa) | $K_{IC}$(MPa√m) |
|---|---|---|
| 2212 | 31 ± 8 | 0.6 ± 0.1 |
| CIPed 2223 | 87 ± 20 | 1.9 ± 0.2 |
| Forged 2223 | 135 ± 15 | 2.9 ± 0.3 |

The 2212 had the poorest overall mechanical properties; the sinter-forged 2223 had the best. Examination by SEM revealed that the 2212 consisted of very large, moderately aligned grains. The grains of the cold isostatically pressed 2223 were smaller, but exhibited the same approximate extent of texture. The average grain size of the sinter forgings was roughly equal to that of the cold isostatically pressed bars, but, as shown in FIG. 2, the grains in the forged bars exhibited substantially stronger textures. X-ray diffraction continued the textures apparent in the fracture surfaces.

High-$T_c$ superconductors have layered, orthorhombic crystal structures and, as a result, highly anisotropic crystal properties. Thermal expansion coefficients are anisotropic, and large stresses can be generated during cooling from the maximum processing temperature. The stresses increase with grain size. To minimize microcracking from these internal stresses, either the grains must be small or the extent of texture must be high. Clearly, the 2212 microstructure was most susceptible to microcracking, and the sinter-forged 2223 was least susceptible. The measured mechanical properties reflected this.

Accordingly, bulk 2223 bars fabricated by cold isostatic pressing and sintering or by sinter forging are the highly preferred material for use in the present invention, as compared to bulk 2212 bars fabricated by directional solidification. $T_c$ values were lowest for the 2212. Transport $J_c$ values at 77 K were 450. A/cm$^2$ for the 2212. 1000 A/cm$^2$ for the pressed and sintered 2223, and 8000 A/cm$^2$ for the sinter-forged 2223. The cast 2212 had the poorest mechanical strength and toughness properties and the sinter-forged 2223 had the best mechanical properties.

While preferred embodiments of the invention have been shown and described, it will be clear to those skilled in the art that various changes and modifications can be made without departing from the invention in its broader aspects as set forth in the claims provided hereinafter.

What is claimed is:

1. A method of synthesizing a high-density bismuth-based superconductor material, consisting of the sequential steps of:

(a) providing an initial ceramic form consisting essentially of a bismuth-based copper oxide;

(b) heat treating said initial ceramic form in air at a temperature less than the incongruent melting temperature of said initial ceramic form, and forming a reactive phase from at least a portion of said initial ceramic form during said heat treating;

(c) cold isostatically pressing said heat-treated ceramic form after the previous heat treating step is ended;

(d) heat treating said heat-treated ceramic form again in an oxygen-containing gas at a temperature less than the incongruent melting temperature of said ceramic form after the previous pressing step is ended;

(e) cold isostatically pressing said ceramic form after the previous heat treating step is ended;

(f) heat treating said ceramic form in air at a temperature less than the incongruent melting temperature of said ceramic form after the previous pressing step is ended; and (g) cold isostatically pressing said ceramic form after the previous heat treating step is ended to yield a ceramic form consisting essentially of a high density bismuth-based superconductor material.

2. The method of synthesizing a high-density bismuth-based superconductor material as defined in claim 1 wherein said bismuth-based copper oxide further consists essentially of $Bi_{1.8}Pb_{0.4}Sr_2Ca_2Cu_3O_{10}$.

3. The method of synthesizing a high-density bismuth-based superconductor material as defined in claim 1 wherein said final form has a density greater than about 4.6 grams per cubic centimeter.

4. A method of synthesizing a high-density bismuth-based superconductor material, consisting of the sequential steps of:

(a) providing an initial ceramic form comprising a bismuth-based copper oxide;

(b) heat treating said initial ceramic form for at least 25 hours in an oxygen-containing gas at a temperature less than the incongruent melting temperature of said ceramic form, and forming a reactive phase from at least a portion of said initial ceramic form during said heat treating;

(c) cold isostatic pressing said heat-treated ceramic form for between about 5 and sixty seconds after the previous heat treating step is ended;

(d) heat treating said ceramic form again for at least 50 hours in air at a temperature less than the incongruent melting temperature of said ceramic form after the previous pressing step is ended;

(e) cold isostatically pressing said ceramic form for between about 5 and 60 seconds after the previous heat treating step is ended;

(f) heat treating said ceramic form further for at least 50 hours in an oxygen-containing gas at a temperature less than the incongruent melting temperature of said ceramic form after the previous pressing step is ended; and (g) cold isostatically pressing said ceramic form after the previous heat treating step is ended to produce a bismuth-based superconducting material.

5. The method of synthesizing a high-density bismuth-based superconductor material as defined in claim 1 wherein at least one of said heat treating steps (d) and (f) has a duration of at least fifty hours.

6. The method of synthesizing a high-density bismuth-based superconductor material as defined in claim 1 wherein at least one of said cold isostatic pressing steps has a duration of between about five and sixty seconds.

7. The method of synthesizing a high-density bismuth-based superconductor material as defined in claim 1 wherein at least one of said cold isostatic pressing steps comprises isostatic pressure application of at least five thousand pounds per square inch.

8. The method of synthesizing a high-density bismuth-based superconductor material as defined in claim 1 wherein said heat treating steps are performed at a temperature between 855 and 870 degrees Celsius at ambient pressure.

9. The method of synthesizing a high-density bismuth-based superconductor material as defined in claim 1, further including the step of sinter-forging said ceramic form.

10. The method of synthesizing a high-density bismuth-based superconductor material as defined in claim 4 wherein said heat treating steps are performed at a temperature between 855 and 870 degrees Celsius at ambient pressure.

11. The method of synthesizing a high-density bismuth-based superconductor material as defined in claim 4 wherein said bismuth-based copper oxide comprises $Bi_{1.8}Pb_{0.4}Sr_2Ca_2Cu_3O_{10}$.

12. The method of synthesizing a high-density bismuth-based superconductor material as defined in claim 4 wherein at least one of said cold isostatic pressing steps comprises isostatic pressure application of at least five thousand pounds per square inch.

* * * * *

UNITES STATES PATENT AND TRADEMARK OFFICE
CERTIFICATE OF CORRECTION

PATENT NO.    : 5,674,814

DATED         : OCTOBER 7, 1997

INVENTOR(S)   : Michael T. Lanagan, et al.

It is certified that error appears in the above-identified patent and that said Letters Patent is hereby corrected as shown below:

In Column 6, line 11, delete "carded" and insert --carried--.
In Column 6, line 25, delete "carded" and insert --carried--.
In Column 7, line 4, delete "22 12" and insert --2212--.
In Column 7, line 6, delete the comma "," after "450".

Signed and Sealed this

Twenty-eighth Day of July, 1998

Attest:

BRUCE LEHMAN

*Attesting Officer*         *Commissioner of Patents and Trademarks*